United States Patent

Tuan

[11] Patent Number: 5,840,605
[45] Date of Patent: Nov. 24, 1998

[54] DUAL LAYER POLYSILICON CAPACITOR NODE DRAM PROCESS

[75] Inventor: Hsiao-Chin Tuan, Hsin-chu, Taiwan

[73] Assignee: Industrial Technology Research Institute, Hsin-chu, Taiwan

[21] Appl. No.: 47,397

[22] Filed: Apr. 19, 1993

[51] Int. Cl.$^6$ .................................................. H01L 21/8242
[52] U.S. Cl. ........................... 438/253; 438/252; 438/394
[58] Field of Search ................................ 437/52, 60, 919, 437/162, 954; 438/250–286, 298–393

[56] References Cited

U.S. PATENT DOCUMENTS

| | | | |
|---|---|---|---|
| 5,021,357 | 6/1991 | Taguchi et al. | 437/52 |
| 5,100,825 | 3/1992 | Fazan et al. | 437/52 |
| 5,110,752 | 5/1992 | Lu | 437/47 |
| 5,118,640 | 6/1992 | Fujii et al. | 437/52 |

*Primary Examiner*—Jey Tsai
*Attorney, Agent, or Firm*—George O. Saile; Stephen B. Ackerman; Rosemary L. S. Pike

[57] ABSTRACT

A gate silicon oxide layer is formed on the silicon substrate. A doped layer of polysilicon is formed over the gate silicon oxide layer. The polysilicon layer is patterned to provide the gate electrodes of the transistor. Source/drain regions are formed through ion implantation followed by spacer formation. A node contact oxide is blanket deposited and an opening is formed therein to the silicon substrate at the location of the buried contact. A dual layer of polysilicon is deposited over the node contact oxide and within the opening to the substrate. This dual layer consists of a bottom layer of undoped polysilicon and a top layer of in-situ doped polysilicon wherein the relative thicknesses of the two layers have been determined to optimize both concentration of dopant at the surface of the capacitor node and junction depth. The substrate is annealed to drive in the buried junction. The dual polysilicon layers are patterned to form the capacitor node. A capacitor dielectric is deposited followed by an in-situ doped polysilicon layer which will form the top capacitor plate. An insulating layer is blanket deposited. An opening is made in the insulating layer to the capacitor plate at the boundary of the cell layer. The contact is completed by the deposition and patterning of a metal layer to complete construction of the capacitor, gate electrode, and source/drain structures with buried contacts.

14 Claims, 2 Drawing Sheets

DUAL LAYER POLYSILICON CAPACITOR NODE DRAM PROCESS

BACKGROUND OF THE INVENTION

(1) Field of the Invention

The invention relates to the fabrication of integrated circuit devices, and more particularly, to a method of forming a capacitor node structure wherein surface concentration and junction depth of a buried contact can be optimized in the manufacture of integrated circuits.

(2) Description of the Prior Art

In the manufacture of integrated circuits containing capacitors, it is necessary to optimize both the capacitor surface dopant concentration and the junction depth of the underlying buried contact.

U.S. Pat. Nos. 5,053,351 to Fazan et al and 5,103,275 to Miura et al describe DRAM capacitor structures. U.S. Pat. No. 5,030,584 to Nakata shows a buried contact process. Prior art processes for conventionally forming buried contacts use a doped polysilicon layer on a silicon substrate and the structure is heated to formed the diffused region in the silicon substrate. The doped polysilicon layer is allowed to remain upon the diffused layer to act as the contact to this diffused region. U.S. Pat. Nos. 4,830,972 and 5,030,584 describe such processes involving outdiffusion from doped polysilicon for forming buried contact diffused regions in a semiconductor substrate. U.S. Pat. No. 5,049,514 to Mori shows a process of doping polysilicon, open metal silicide layer, ion implanting, and annealing to form the source/drain region.

The problem with this method is to achieve the desired junction depth and doping concentration in the buried junction. The drawbacks of the prior art processes are insufficient doping concentration at the polysilicon diffused region interface and high polysilicon resistance. The polysilicon cannot be too heavily doped because this would result in too deep a buried contact junction. Co-pending patent application Ser. No. 07/982,598 filed Nov. 27, 1992 (E81-0005) to H. M. Chou and H. H. Choa entitled "Fabrication of Transistor with Buried Contacts" addresses this problem with a dual layer polysilicon process. The present invention involves a different dual layer polysilicon process.

SUMMARY OF THE INVENTION

A principal object of the present invention is to provide an effective and very manufacturable method of forming a capacitor node structure.

Another object of the present invention is to provide a dual polysilicon technique which allows optimization of surface concentration and junction depth of a buried contact in a capacitor node structure.

In accordance with the objects of this invention the method of forming an integrated circuit field effect transistor having a capacitor, gate electrode, and source and drain elements with buried contacts to a silicon substrate is described. A gate silicon oxide layer is formed on the silicon substrate. A doped layer of polysilicon is formed over the gate silicon oxide layer. The polysilicon layer is patterned to provide the gate electrodes of the transistor. Source/drain regions are formed through ion implantation into the silicon substrate followed by spacer formation. A node contact oxide is blanket deposited and an opening is formed therein to the silicon substrate at the location of the buried contact. A dual layer of polysilicon is deposited over the node contact oxide and within the opening to the substrate. This dual layer consists of a bottom layer of undoped polysilicon and a top layer of in-situ doped polysilicon wherein the relative thicknesses of the two layers have been determined to optimize both concentration of dopant at the surface of the capacitor node and junction depth. The substrate is annealed to drive in the buried junction. The dual polysilicon layers are patterned to form the capacitor node. A capacitor dielectric is deposited followed by an in-situ doped polysilicon layer which will form the top capacitor plate. An insulating layer is blanket deposited. An opening is made in the insulating layer to the capacitor plate at the boundary of the cell layer. The contact is completed by the deposition and patterning of a metal layer to complete construction of the capacitor, gate electrode, and source/drain structures with buried contacts.

BRIEF DESCRIPTION OF THE DRAWINGS

In the accompanying drawings forming a material part of this description, there is shown.

DESCRIPTION OF THE PREFERRED EMBODIMENTS

Figure 1:
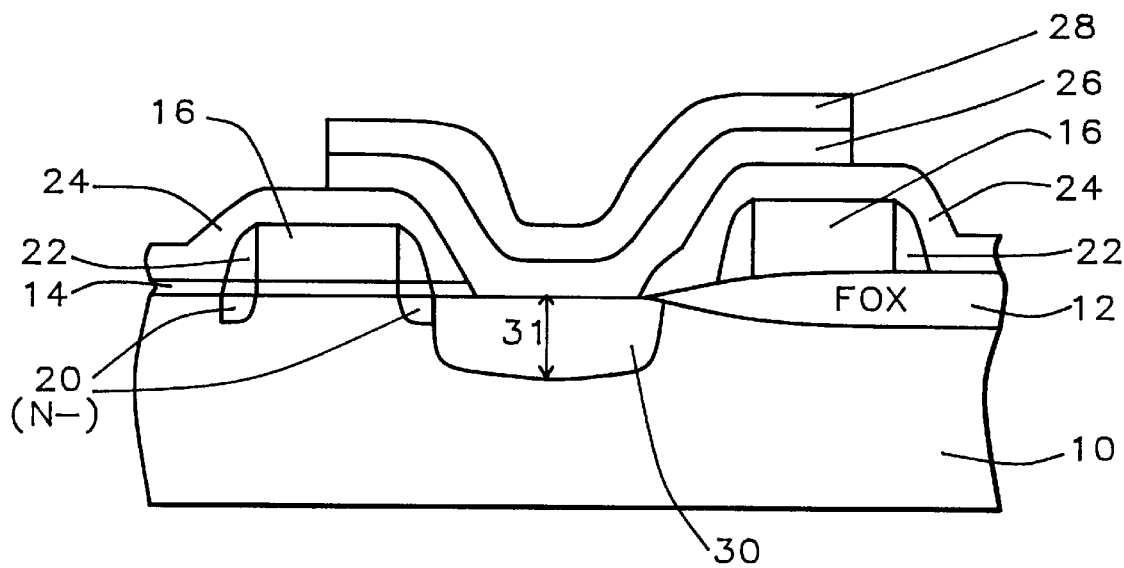
FIGS. 1 through 3 schematically illustrate in cross-sectional representation one preferred embodiment of this invention.

Referring now more particularly to FIG. 1, there is shown an illustration of a portion of a partially completed integrated circuit. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

The surface of the silicon substrate 10 is thermally oxidized to form the desired gate oxide 14 thickness which is between about 100 to 250 Angstroms. The polysilicon layer 16 is blanket deposited by low pressure chemical vapor deposition (LPCVD) of silane reduction at about 620° C. to a preferred thickness of between about 1500 to 3500 Angstroms. The polysilicon layer 16 is ion implanted with phosphorus ions under the conditions 2 E 15 to 1 E 16 dosage per $cm^2$ and 40 to 100 Kev or doped with phosphorus oxychloride at a temperature of about 900° C. The layer 16 is patterned using lithography and anisotropic etching techniques as conventional in the art to provide a desired pattern of gate electrodes and interconnection runners on the FOX 12 surfaces or elsewhere as seen in FIG. 1.

The source/drain structure of the MOS FET may now be formed by the following steps. FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

FIG. 1, for example shows the ion implantations of N-dopants. Lithographic masks may be required to protect the areas not to be subjected to that particular N- ion implantation. The formation of the lithographic masks are done by conventional lithography and etching techniques. The N- lightly doped drain implantation 20 is done with, for example phosphorus at a dose of between about 1 E 13 to 4 E 13 atoms/cm$^2$ and with an energy of between about 30 to 80 Kev.

The dielectric spacer 22 is now to be formed followed by the completion of the lightly doped drain source/drain structures. The deposition of the spacer dielectric film is TEOS based low pressure chemical vapor deposition oxide at a temperature of about 700 to 720° C.

An anisotropic etching of this layer produces the dielectric spacer layer 22 on the sidewalls of the polysilicon structures 16. The preferred anisotropic etching uses a conventional reactive ion etching ambient.

A node contact silicon oxide layer 24 is blanket deposited over the device structures, preferably using low pressure chemical vapor deposition (LPCVD) to a thickness of between about 800 to 2000 Angstroms.

Conventional photolithographic methods are employed to define the buried contact. The node contact silicon oxide layer 24 is etched by conventional plasma etching or reactive ion etching techniques to form an opening 18 to the substrate 10.

The critical buried contact process of the present invention will now be described. The surface concentration of the polysilicon capacitor node (after patterning and final heat treatment) should be high enough; that is, greater than or equal to 5 E 19 atoms/cm$^3$; so that no local depletion occurs. At the same time, the junction depth 31, determined by the N+ doped polysilicon diffusion after final heat treatment, cannot be deeper than 0.45 micrometers. In the conventional process, it is difficult to optimize these two conditions simultaneously. The solution, in the form of the present invention, calls for dividing the polysilicon node into two parts wherein the bottom layer is undoped and the top layer is in-situ doped. Then, for a constant volume concentration, the surface concentration and junction depth can be optimized by varying the thicknesses of the two parts.

Figure 4:
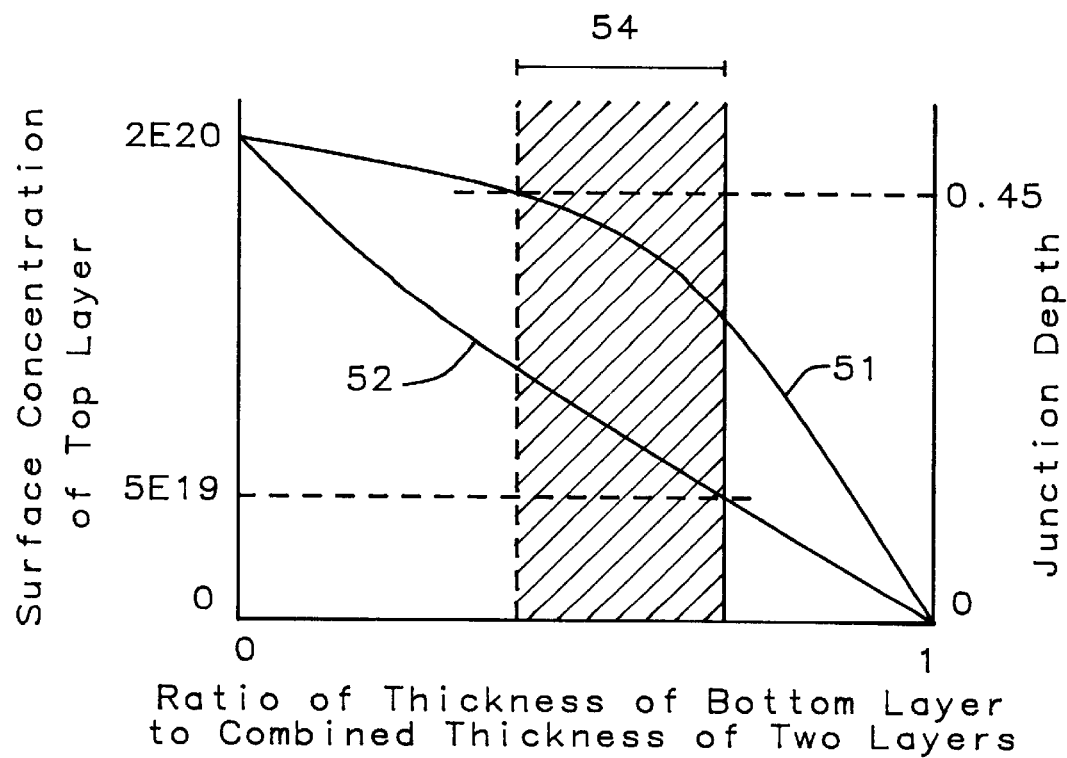
FIG. 4 graphically illustrates the relationship between polysilicon layer thicknesses and surface concentration and junction depth.

Referring to FIG. 4, there is shown a graph relating the thicknesses of the two layers to surface concentration and junction depth. The bottom axis depicts the ratio of the thickness of the bottom layer to the combined thickness of the two layers. Line 51 illustrates the junction depth for the varying thicknesses and line 52 illustrates the surface concentration. If there is no bottom layer, the ratio is 0 and the surface concentration and junction depth are at a maximum. If there is no top layer, the ratio is 1. The bottom layer is undoped so there would be no junction formed; therefore, the junction depth and surface concentration would both be 0.

The boundary conditions are: (1) junction depth must be less than 0.45 micrometers, but greater than 0. A sufficient buried contact is needed, but the junction depth cannot be too great or the buried region would spread into the adjacent channel region. (2) the surface concentration of the top layer must be greater then about 5 E 19 atoms/cm$^3$ or when voltage is applied to the node, the depletion width will be added into the capacitor dielectric effective thickness which would detrimentally lower capacitance.

The region 54 in FIG. 4 denotes the ratios of the thickness of the bottom layer to the total thickness of the two layers which satisfy the two criteria. In the inventor's experience, the satisfying ratio region should be between about 0.4 to 0.7.

Returning to FIG. 1, having determined the optimum thicknesses of the two polysilicon layers, we now deposit those layers. The bottom undoped polysilicon layer 26 is deposited using LPCVD at a temperature of between about 600 to 630° C. with a preferred temperature of 620° C. Next, the in-situ doped polysilicon layer 28 is deposited by LPCVD at a temperature of between about 560 to 600° C. This layer is doped with phosphorus with a doping concentration of between about 1 E 20 to 2 E 20 atoms/cm$^3$.

The structure is heated to a temperature of between about 800 to 850 ° C. for 30 to 60 minutes to form the buried contact region 30. The polysilicon layers 26 and 28 are patterned by conventional anisotropic etching to form the capacitor node structure shown in FIG. 1.

Figure 2:
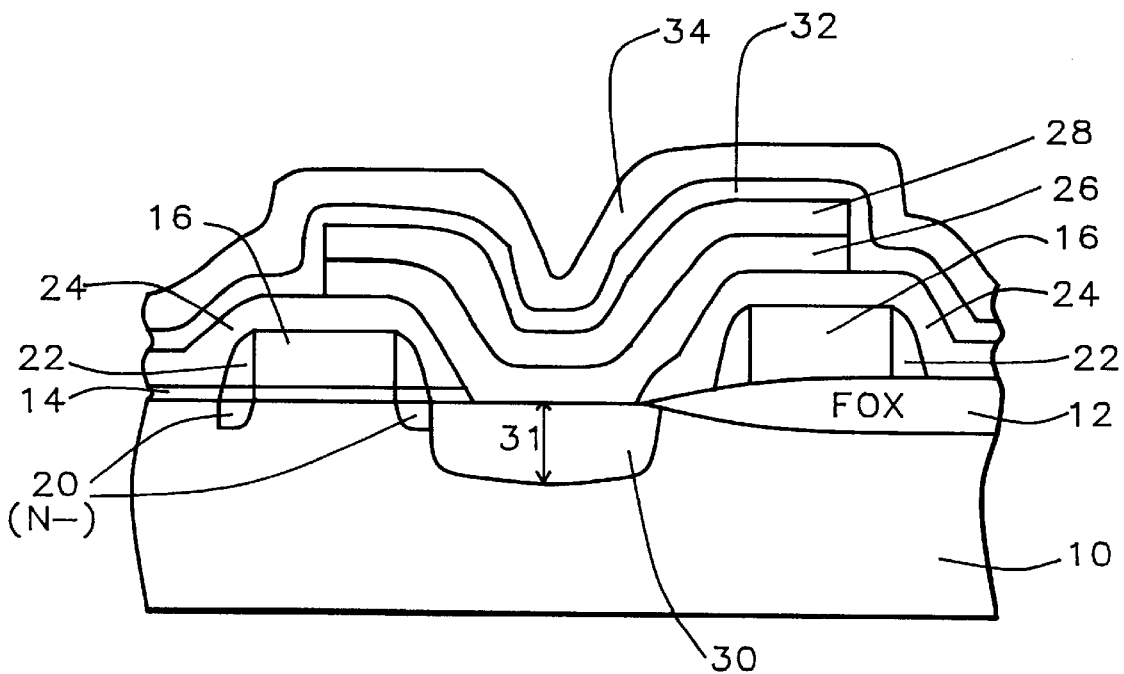

Referring now to FIG. 2, a capacitor dielectric layer 32 is formed consisting of silicon oxide-silicon nitride-silicon oxide (ONO), silicon nitride-silicon oxide (NO) or other suitable known dielectric. A second layer of in-situ doped polysilicon 34 forms the top capacitor plate. This layer is deposited by LPCVD at a temperature of between about 560 to 600 ° C. with a doping concentration of about 2 E 20 atoms/cm$^3$.

Figure 3:
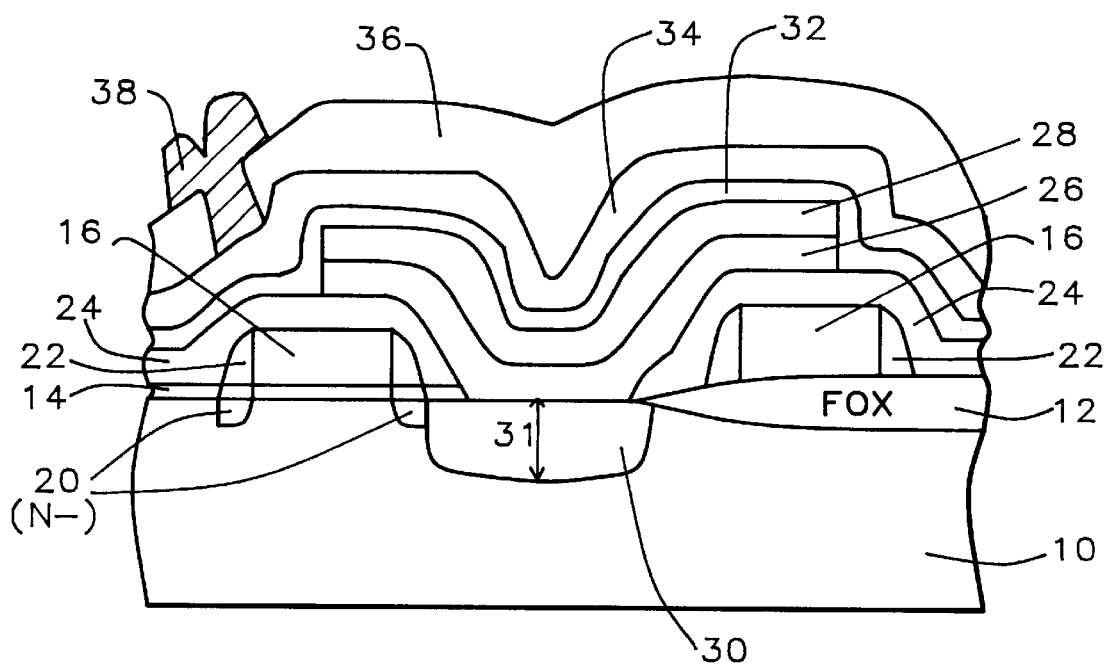

Referring to FIG. 3, an insulating layer 36 is deposited over all, consisting of borophosphosilicate glass (BPSG) flowed at between 850 to 900 ° C., or a combination of undoped glass and BPSG. An opening is made through the insulating layer 36 to the capacitor plate 34 at the boundary of the cell area.

The bit line contact openings (not shown) are formed as is known in the art. A layer of undoped polysilicon is deposited followed by ion implant doping into the polysilicon. The polysilicon is patterned by lithography and etching. BPSG or a combination of silicon dioxide and BPSG is deposited as an insulator.

The contact may be completed by forming openings through the insulator layer to the polysilicon layer followed by the deposition and patterning of a metal layer 38.

While the invention has been particularly shown and described with reference to the preferred embodiments thereof, it will be understood by those skilled in the art that various changes in form and details may be made without departing from the spirit and scope of the invention.

What is claimed is:

1. The method of forming a DRAM capacitor structure with buried junction comprising:

forming a gate silicon oxide layer on a silicon substrate;

depositing a first doped layer of polysilicon over said gate silicon oxide layer;

patterning said first doped polysilicon layer to form gate electrodes;

implanting ions into said silicon substrate to form source/drain regions within said silicon substrate;

depositing a dielectric layer over said gate electrodes and an isolation layer;

anisotropically etching said dielectric layer to form dielectric spacers on the sidewalls of said gate electrodes;

depositing a node contact oxide layer over said gate electrodes and said isolation layer;

forming an opening in said node contact oxide layer to said silicon substrate;

depositing a dual layer of polysilicon over said node contact oxide layer and within said opening wherein said dual layer of polysilicon consists of a bottom layer of undoped polysilicon and a top layer of in-situ doped polysilicon and wherein the relative thicknesses of the said bottom layer and the said top layer of the said dual layer of polysilicon are calculated so as to optimize both the concentration of dopant at the surface of said capacitor node and the junction depth of said buried junction wherein said concentration of dopant at the surface must be greater than about 5 E 19 atoms/cm3 and wherein said junction depth must be less than about 0.45 micrometers and greater than 0;

annealing said substrate to drive in said dopant through said dual layer of polysilicon to form said buried junction within said substrate underlying said opening;

patterning said dual polysilicon layer to form the capacitor node;

depositing a capacitor dielectric layer over said capacitor node; and depositing a second in-situ doped polysilicon layer over said capacitor dielectric to form the top capacitor plate to complete formation of said capacitor node structure with buried junction.

2. The method of claim 1 wherein the thickness of said first doped polysilicon layer is between about 1500 and 3500 Angstroms and it is in situ doped.

3. The method of claim 1 wherein said first doped polysilicon layer is deposited as undoped and then is ion implanted with phosphorus ions.

4. The method of claim 1 wherein the thickness of said node contact oxide layer is between about 800 and 2000 Angstroms.

5. The method of claim 1 wherein said bottom undoped layer of said dual layer polysilicon is deposited by low pressure chemical vapor deposition (LPCVD) at a temperature of between about between about 600° to 630° C.

6. The method of claim 1 wherein said top doped layer of said dual layer polysilicon is deposited by low pressure chemical vapor deposition (LPCVD) at between 560° and 600° C. and is in-situ doped with phosphorus with a doping concentration of between about 1 E 20 to 2 E 20 atoms/cm$^2$.

7. The method of claim 1 wherein said annealing step is performed at a temperature of between about 800° to 850° C. for between about 30 to 60 minutes.

8. The method of claim 1 wherein said capacitor dielectric layer is composed of silicon oxide-silicon nitride-silicon oxide (ONO) and has a preferred thickness of between about 60 to 150 Angstroms.

9. The method of claim 1 wherein said capacitor dielectric layer is composed of silicon nitride-silicon oxide (NO) and has a preferred thickness of between about 60 to 150 Angstroms.

10. The method of claim 1 wherein contact is made to said capacitor top plate by depositing an insulating layer over said capacitor top plate, forming an opening through said insulating layer to said capacitor top plate at the boundary of said capacitor area, and completing said contact by depositing and patterning a metal layer wherein said metal layer fills said opening.

11. The method of forming a buried contact a capacitor node structure comprising:

forming a gate silicon oxide layer on a silicon substrate;

depositing a first doped layer of polysilicon over said gate silicon oxide layer;

patterning said first doped polysilicon layer to form gate electrodes;

implanting ions into said silicon substrate to form source/drain regions within said silicon substrate;

depositing a dielectric layer over said gate electrodes and an isolation layer;

anisotropically etching said dielectric layer to form dielectric spacers on the sidewalls of said gate electrodes;

depositing a node contact oxide layer over said gate electrodes and said isolation layer;

forming an opening in said node contact oxide layer to said silicon substrate over the location of said buried contact;

depositing a dual layer of polysilicon over said node contact oxide layer and within said opening wherein said dual layer of polysilicon consists of a bottom layer of undoped polysilicon and a top layer of in-situ doped polysilicon and wherein the relative thicknesses of the said bottom layer and the said top layer of the said dual layer of polysilicon are calculated so as to optimize both the concentration of dopant at the surface of said capacitor node and the junction depth of said buried junction wherein said concentration of dopant at the surface must be greater than about 5 E 19 atoms/cm3 and wherein said junction depth must be less than about 0.45 micrometers and greater than 0;

annealing said substrate to drive in said dopant through said dual layer of polysilicon to form said buried contact within said substrate underlying said opening;

patterning said dual polysilicon layer to form the capacitor node;

depositing a capacitor dielectric layer over said capacitor node; and depositing a second in-situ doped polysilicon layer over said capacitor dielectric to form the top capacitor plate to complete formation of said capacitor node structure.

12. The method of claim 11 wherein said bottom undoped layer of said dual layer polysilicon is deposited by low pressure chemical vapor deposition (LPCVD) at a temperature of between about 600° to 630° C.

13. The method of claim 11 wherein said top doped layer of said dual layer polysilicon is deposited by low pressure chemical vapor deposition (LPCVD) at between 560° and 600° C. and is in-situ doped with phosphorus with a doping concentration of between about 1 E 20 to 2 E 20 atoms/cm$^2$.

14. The method of claim 11 wherein said annealing step is performed at a temperature of between about 800° to 850° C. for between about 30 to 60 minutes.

* * * * *